(12) United States Patent
Böhm et al.

(10) Patent No.: US 7,158,405 B2
(45) Date of Patent: Jan. 2, 2007

(54) SEMICONDUCTOR MEMORY DEVICE HAVING A PLURALITY OF MEMORY AREAS WITH MEMORY ELEMENTS

(75) Inventors: Thomas Böhm, Zorneding (DE);
Stefan Lammers, South Burlington, VT (US); Thomas Röhr, Yokohama (JP)

(73) Assignee: Infineon Technologies AG, Munich (DE)

( * ) Notice: Subject to any disclaimer, the term of this patent is extended or adjusted under 35 U.S.C. 154(b) by 446 days.

(21) Appl. No.: 10/190,812

(22) Filed: Jul. 8, 2002

(65) Prior Publication Data

US 2003/0007382 A1   Jan. 9, 2003

(30) Foreign Application Priority Data

Jul. 6, 2001   (DE) ................................ 101 32 849

(51) Int. Cl.
*G11C 11/00* (2006.01)
(52) U.S. Cl. ............. 365/158; 365/230.03; 365/230.06
(58) Field of Classification Search ................ 365/158, 365/230.03, 230.06, 230.07, 69
See application file for complete search history.

(56) References Cited

U.S. PATENT DOCUMENTS

| | | | |
|---|---|---|---|
| 5,777,927 A | 7/1998 | Takahashi et al. | |
| 5,852,574 A | 12/1998 | Naji | |
| 5,920,500 A | 7/1999 | Tehrani et al. | |
| 5,946,227 A * | 8/1999 | Naji | 365/158 |
| 6,034,882 A | 3/2000 | Johnson et al. | |
| 6,064,620 A | 5/2000 | Mobley | |
| 6,327,214 B1 * | 12/2001 | Yoon et al. | 365/230.03 |
| 6,493,258 B1 * | 12/2002 | Lu et al. | 365/158 |
| 6,567,287 B1 * | 5/2003 | Scheuerlein | 365/51 |

FOREIGN PATENT DOCUMENTS

DE   197 26 852 A1   2/1998

OTHER PUBLICATIONS

Brown, et al.: "1-Mb Memory Chip Using Giant Magnetoresistive Memory Cells", IEEE Transactions on Components, Packaging, and Manufacturing Technology-Part A, vol. 17, No. 3, Sep. 1994, pp. 373-379.
Kiyoo Itoh: "Trends in Megabit DRAM Circuit Design", *IEEE Journal of Solid-State Circuits*, vol. 25, No. 3, Jun. 1990, pp. 778-789.
Kiyoo Itoh et al.: "Trends in Low-Power RAM Circuit Technologies", *Proceedings of the IEEE*, vol. 83, No. 4, Apr. 1995, pp. 524-543.
Kiyoo Itoh et al.: "Limitations and Challenges of Multigigabit DRAM Chip Design", *IEEE Journal of Solid-State Circuits*, vol. 32, No. 32, No. 5, May 1997, pp. 624-634.
Kiyoo Itoh et al.: "Reviews and Prospects of High-Density RAM Technology", *International Semiconductor Conference*, Oct. 10-14, 2000, vol. 1, pp. 13-22.

* cited by examiner

*Primary Examiner*—Huan Hoang
(74) *Attorney, Agent, or Firm*—Laurence A. Greenberg; Werner H. Stemer; Ralph E. Locher

(57) ABSTRACT

A semiconductor memory device has a particularly space-saving configuration of the memory areas and, in particular, of the selection devices assigned to the memory areas. During operation, each selection device can be assigned in a controllable manner to a plurality of memory areas such that selectively each of the selection devices can carry out an addressing and selection in one of the assigned memory areas.

22 Claims, 2 Drawing Sheets

SEMICONDUCTOR MEMORY DEVICE HAVING A PLURALITY OF MEMORY AREAS WITH MEMORY ELEMENTS

BACKGROUND OF THE INVENTION

Field of the Invention

The invention relates to a semiconductor memory device having a plurality of memory areas with memory elements. Modern semiconductor memory devices, in particular MRAMs (Magnetoresistive Random Access Memories) or the like, include a plurality of memory elements which are provided in a plurality of at least essentially organizationally separate memory areas and which are addressable and/or selectable at least during operation via provided access line devices, in particular bit lines and word lines. A corresponding selection device is assigned to each memory area during operation, via which selection device the respective access line devices, namely the bit lines and word lines, can be activated for the addressing and driving of a specific memory cell or of a specific memory element.

Conventional semiconductor memory devices use a corresponding selection device for each of at least organizationally separated memory areas. Since each selection device is likewise realized as a semiconductor circuit device, the space requirement for the respective selection devices also increases in the case of a plurality of memory areas to be formed, in accordance with the number of selection devices that are then to be provided so that the space occupied by the plurality of selection devices then makes up an appreciable proportion of the total area which has to be made available for the entire semiconductor memory device. This outlay on area is at odds with the objective of achieving the highest possible integration densities and is particularly noteworthy in particular also in the case of memory areas based on transistor arrays.

However, in particular in the case of semiconductor memory devices with magnetoresistive memory elements—for example so-called MRAM memory devices—there is additionally the need to subdivide the entire memory space into a plurality of separate memory areas. In the case of crosspoint array MRAMs, this is related in particular with the parasitic currents which form and which occur parallel to the respectively selected line devices or selection line devices during addressing. In order to limit the magnitude of the parasitic currents that occur, it is necessary, therefore, to subdivide the totality of all the memory elements or memory cells to be addressed into so-called separated cell arrays, memory arrays or memory areas which are then each assigned a selection device for addressing and driving, so that, seen overall, each memory area inherently has to afford in each case a comparatively small parasitic current. As a result, the variation of the current along a line is so small that only selected cells are written to.

A further reason for separate memory areas in MRAMs is that the write current must be ensured in the case of a falling or decreasing voltage.

SUMMARY OF THE INVENTION

It is accordingly an object of the invention to provide a semiconductor memory device which overcomes the above-mentioned disadvantages of the heretofore-known semiconductor memory devices of this general type and in which a particularly high integration density and/or efficiency can be achieved.

With the foregoing and other objects in view there is provided, in accordance with the invention, a semiconductor memory device, including:

memory areas at least substantially organizationally separated from one another;

access line devices;

memory elements provided in the memory areas, the memory elements being addressable and/or selectable via the access line devices at least during operation; and selection devices, each of the memory areas having, at least during operation, at least one of the selection devices assigned thereto for performing a selection, such that during operation, each of the selection devices for a plurality of the memory areas is controllable and, as a result, in a controllable manner, an addressing and/or a selection in one of the memory areas of the plurality of the memory areas can be selectively controlled with each of the selection devices during operation.

In other words, a semiconductor memory device, in particular an MRAM memory or the like includes a plurality of memory elements, which are provided in a plurality of at least essentially organizationally separate memory areas and which are addressable and/or selectable at least during operation via provided access line devices, in particular bit lines and word lines, at least one selection device is assigned to each memory area for selection purposes at least during operation, and, during operation, each selection device is controllable and, in particular, alternately assignable to a plurality of memory areas, and, as a result, in a controllable manner optionally through the use of each selection device, during operation, an addressing and/or selection can be controlled and, in particular, alternately carried out in one of the memory areas of the plurality of assignable memory areas.

The semiconductor memory device according to the invention is characterized in that during operation, each selection device is controllable and, in particular, alternately assignable to a plurality of memory areas, and in that, as a result, in a controllable manner optionally through the use of each selection device, during operation, an addressing and/or selection can be controlled and, in particular, alternately carried out in one of the memory areas of the plurality of assignable memory areas.

It is thus a basic idea of the present invention for each selection device provided to be assigned the management and addressing not just of one memory area but of a plurality of memory areas. What is thereby achieved in contrast to the prior art is that a relatively smaller number of selection devices are required for the addressing of the totality of all the memory elements distributed over memory areas. The area requirement for the totality of all the selection devices is thereby reduced overall. Consequently, the area can be reduced with the storage capacity remaining the same or with the totality of all the memory elements remaining the same, as a result of which a higher integration density and/or chip efficiency is produced. This means, in other words, that different memory areas of the totality of all the memory elements of the semiconductor memory device in each case share a selection device for addressing and driving.

In accordance with a preferred embodiment of the semiconductor memory device according to the invention, the memory areas provided are in each case cell arrays and/or areas of cell arrays of memory elements or memory cells, in particular crosspoint array configurations and transistor array configurations.

The access lines for each memory element in the memory areas are preferably configured as bit lines and/or as word lines. In this case, in particular respectively corresponding bit line decoders and/or word line decoders are provided as selection devices.

It is particularly advantageous that, in accordance with a further embodiment of the semiconductor memory device according to the invention, the selection devices, in particular the bit line decoders and/or the word line decoders, are arranged and/or formed in essentially direct spatial proximity to the respectively assigned or assignable memory areas, in particular in the latter's respective peripheral area, edge area or the like. This results, in a particularly advantageous manner, in a flexible use of the respective selection device with regard to the assigned memory areas to be managed.

In this case, it is particularly advantageous if the selection device, in particular the bit line decoder and/or the word line decoder, can be assigned or is assigned in each case to a plurality of memory areas arranged essentially laterally and/or vertically and/or in essentially direct spatial proximity with respect to one another.

Particularly simple geometrical conditions result if the selection device, in particular the bit line decoder and/or word line decoder, is arranged and/or formed in each case in an essentially lateral and/or vertical intermediate region between at least some of the assigned memory areas.

In accordance with a further preferred embodiment of the semiconductor memory device according to the invention, it is provided that the selection device, in particular the bit line decoder and/or the word line decoder, is formed and configured to select, during operation, in each case at most one of the respectively assigned memory areas for the addressing of the memory elements, in particular in response to an external area selection signal.

As an alternative or in addition, the decoder could also select a plurality of memory areas from which in each case one or more bit lines or word lines are written to or read.

For the selection of one of the assigned memory areas, the respective selection device, in particular the bit line decoder and/or the word line decoder, has a selection circuit, in particular a selection transistor circuit.

These and further aspects are explained further on the basis of the remarks below:

A concrete area of use for the inventive concept is possible and expedient in magnetoresistive memory elements, so-called MRAMs. The memory effect of magnetoresistive memories resides in the variable resistance of the respective memory cells (MTJ: Magnetic Tunnel Junction). In the case of the basic construction of an MRAM memory cell or an MRAM memory element, the actual memory element, including two magnetic layers which are separated from one another by a thin dielectric layer, is situated at the crossover point between two access line devices, namely a word line and a bit line. Depending on the polarization or the orientation of the magnetization of the magnetic layers, a relatively high or a relatively low value results for the ohmic resistance of the memory element or the memory cell.

One of the magnetic layers can be subjected to polarization reversal or magnetization reversal through the use of a write current on the word line and the bit line. The other magnetic layer is composed of a hard-magnetic material, and its polarization or magnetization is not altered by the write currents. In order that the respective soft-magnetic layer can be magnetized or polarized in two opposite directions, it is necessary that at least one of the write currents on the bit line or on the word line can flow in both directions through the lines, in particular that current which generates the so-called easy axis field.

On account of high parasitic currents on a selected word line or bit line, a magnetoresistive memory area having a large extent, in particular in the case of crosspoint configurations, can only be constructed from a plurality of smaller memory arrays in order that the respective parasitic current does not exceed certain limits. This results in memory architectures with a large peripheral proportion which has to be afforded for the respective selection devices. In other words, a considerable proportion of the entire chip area is taken up by the so-called selection devices or decoders. In order to connect the current sources and current sinks to the respectively selected word lines or bit lines, so-called transfer transistor devices or transfer transistors are required in magnetoresistive memory devices at both ends of the respective word line areas or bit line areas. These transistors are selected by the selection devices or decoders. In addition, the decoders are required for the selection of a current source or current sink.

A fundamental aspect of the present invention is to provide, in particular for MRAM architectures, a space-saving configuration in the case of which the word line decoders and the bit line decoders are arranged particularly effectively yet in a space-saving manner.

Usually, the transfer transistor devices of the respective word lines and bit lines are situated directly at the cell array edge in the case of MRAM cell arrays. The selection devices, i.e. the word line decoders and the bit line decoders, activate the transfer transistors, namely the bit line transfer transistors and the word line transfer transistors, at both ends of the selected lines, so that a current can flow through the respective line. In other words, a selection device or a decoder is typically situated at each side of the cell array.

However, it is also conceivable and advantageous if a selection device or a decoder is provided for a plurality of memory areas or arrays, if appropriate the selection devices then running over the cell arrays or arrays. Consequently, a type of global decoder is also conceivable.

In the case of magnetoresistive memory devices, the size of the cell arrays and thus the length of the word lines and bit lines is limited for the reasons mentioned above. The length of a line determines the voltage drop along this line during the write operation. This voltage drop adversely affects the transfer transistors and the current sources, which are typically configured as current mirror circuits. The write current is limited on account of the voltage drop. In the case of magnetoresistive memories, in particular if the latter are constructed from crosspoint cells, a further disadvantage in the case of long word lines and bit lines is the fact that the cells are constructed as resistance cells, as a result of which high parasitic currents arise along the selected lines during the write operation, namely as a result of superposition of those currents which flow through the nonselected cell array areas.

On account of the disadvantages described, large magnetoresistive memories can only be constructed from a plurality of small memory cell arrays. In an architecture of this type the area requirement for the external circuitry, by virtue of the selection devices or decoders, would conventionally take up a large areal proportion of the entire sectional area.

By contrast, if, according to the invention, the selection devices are used jointly for different cell arrays, then the chip area can be decisively reduced or provided for other memory areas. In this case, through the use of a transistor, a selection device or a decoder is switched to one of the assigned cell arrays. In this case, then a decoder is required which selects the cell array to be activated. This decoder can be used to activate the respective transfer transistor. The lines of the output signals of the cell array decoder can run in a space-saving manner, for example, over the word line or bit line decoders.

Since the assigned memory areas or cell arrays can be arranged not only adjacent laterally from one another but also adjacent vertically with respect to one another, a possible application is also advantageously afforded in magnetoresistive memories in which a plurality of vertical layers are formed, that is to say in so-called multilayer magnetoresistive memories. A plurality of memory areas or cell arrays stacked one above the other are thus produced. Individual planes can be activated or deactivated with the aid of a corresponding plane selection switch or area switch. In multilayer MRAMs, besides the plane switch, only a selection device or a decoder at each side of the cell array is required, which selects a word line or bit line on the word lines or bit lines of a plane. The plane to be activated is selected by the plane switch. Since the number of planes that can be stacked one above the other is also limited, a large multilayer MRAM also includes a plurality of small multilayer cell arrays. In the multilayer MRAMs, a decoder can be shared or assigned in a distributed manner between the cell arrays stacked one above the other and the adjacent cell arrays.

Thus, a basic idea of the present invention is the joint use of word line decoders or bit line decoders for different memory areas or memory arrays in particular in magnetoresistive memories. The chip area required for the entire storage capacity can be decisively reduced as a result.

Other features which are considered as characteristic for the invention are set forth in the appended claims.

Although the invention is illustrated and described herein as embodied in a semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
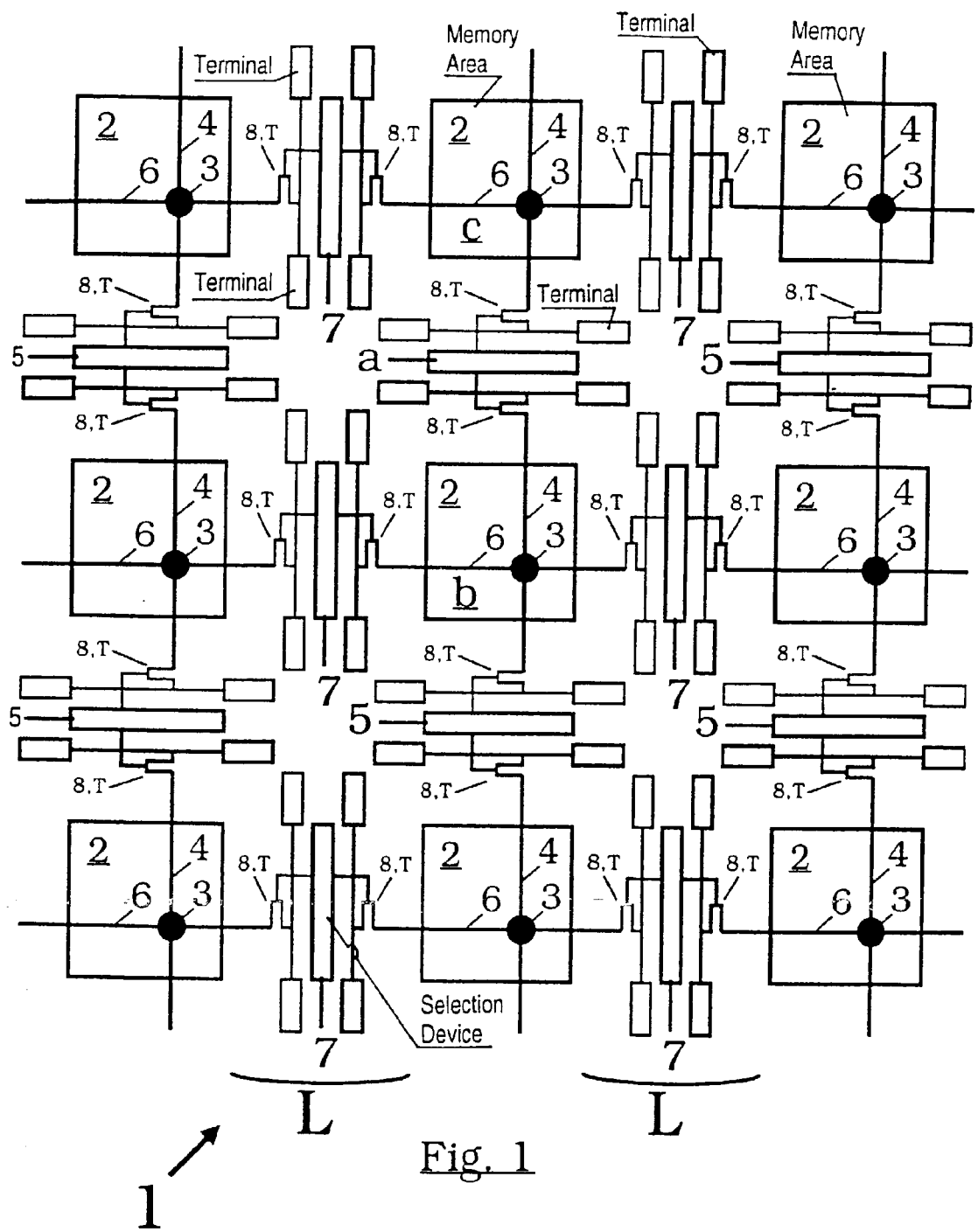
FIG. 1 is a schematic plan view of an embodiment of the semiconductor memory device according to the invention.

Referring now to the figures of the drawings in detail and first, particularly, to FIG. 1 thereof, there is shown an embodiment of the semiconductor memory device 1 according to the invention in a schematic plan view. The semiconductor memory device includes nine memory areas 2 which are arranged in a matrix-like manner and are formed by a plurality of memory cells 3 which, for their part, are to be driven via corresponding access line devices 4 and 6.

The separate memory areas 2 are spatially separated from one another, lateral intermediate regions L being produced between adjacent memory areas 2. Selection devices 5 and 7, via which access line devices 4 and 6 can be driven, are in each case formed in the lateral intermediate regions L.

Corresponding addressing has the effect that a given selection device 5, 7 in the respective intermediate region L between two adjacent memory areas 2 can optionally drive one memory area or the other. Thus, in FIG. 1, it is provided that the bit line decoder 5 designated by "a" can optionally drive the memory area 2 designated by "b" or the memory area 2 designated by "c." It is also conceivable for both memory areas or a plurality thereof to be driven.

The same applies correspondingly to the other bit line decoders 5 and to the word line decoders 7. For the realization of the optional selection, corresponding selection circuits 8 are additionally provided here in the form of so-called selection transistors T, which are connected by their control terminals to the respective selection devices 5 and 7. When the respective selection transistor T is driven, a corresponding power supply is switched, via corresponding terminals, through to the respectively selected access line device 4 or 6, so that a selected memory cell 3 can be addressed through the use of a corresponding current flow at the crossover point between the selected access line devices 4 and 6.

Figure 2:
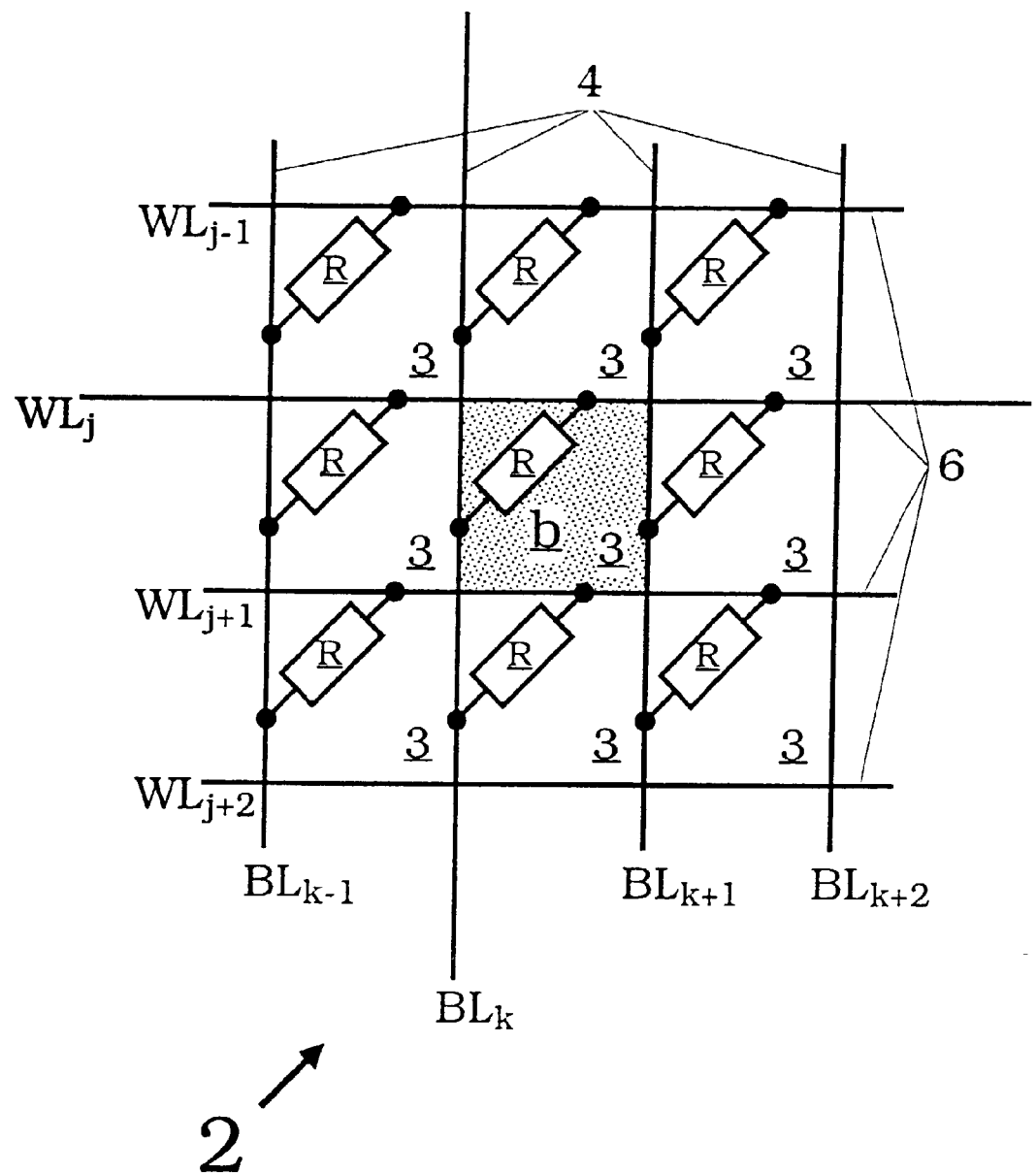
FIG. 2 is a schematic view illustrating the construction of a memory area of the embodiment from FIG. 1.

FIG. 2 shows in greater detail a typical memory area 2 with a plurality of memory elements or memory cells 3 arranged in a matrix-like manner. The access line devices 4 and 6 are in this case formed by a finite number of bit lines BL and word lines WL. Tunneling resistances R dependent on the magnetic ambient conditions are produced at the geometrical crossover points between the respective bit lines BL and word lines WL. In the respective periphery of the memory area or cell array 2, a bit line decoder 5 and a word line decoder 7 are provided as selection devices for the selection of the bit lines BL and the word lines WL, respectively. In the situation shown in FIG. 2, the bit line BLk and also the word line WLj and correspondingly the central memory element 3 with the corresponding magnetic tunneling resistance R are selected.

We claim:

1. A semiconductor memory device, comprising:
memory areas at least substantially organizationally separated from one another;
access line devices;
memory elements provided in said memory areas, said memory elements being at least one of addressable and selectable via said access line devices at least during operation; and
selection devices, each of said memory areas having, at least during operation, at least one of said selection devices in substantially direct spatial proximity assigned thereto for performing a selection, such that during operation, each of said selection devices for and assigned to a plurality of said memory areas is controllable and, as a result, in a controllable manner, at least one of an addressing and a selection in one of said memory areas of said plurality of said memory areas is be selectively controlled with each of said respective assigned selection devices during operation;
said memory elements being memory cells of MRAM type;
said memory areas with said memory elements, said access line devices and said selection devices together forming an MRAM memory;

said memory areas being one of cell arrays and cell array regions formed by said memory elements;

at least one of a bit line decoder and a word line decoder being provided as a corresponding one of said selection devices.

2. The semiconductor memory device according to claim 1, wherein said access line devices are bit lines and word lines.

3. The semiconductor memory device according to claim 1, wherein each of said selection devices is configured to be alternately assigned to said plurality of said memory areas during operation.

4. The semiconductor memory device according to claim 1, wherein at least one of the addressing and the selection in said one of said memory areas of said plurality of said memory areas is be alternately performed with each of said selection devices during operation.

5. The semiconductor memory device according to claim 1, wherein said memory areas are configurations selected from the group consisting of crosspoint array configurations and transistor array configurations.

6. The semiconductor memory device according to claim 1, wherein:

at least one of a bit line and a word line are provided as one of said access line devices for each of said memory elements in said memory areas.

7. The semiconductor memory device according to claim 6, wherein at least one of said bit line decoder and said word line decoder is disposed in a substantially direct spatial proximity to a respectively assigned one of said memory areas.

8. The semiconductor memory device according to claim 6, wherein at least one of said bit line decoder and said word line decoder is configured to be assigned in each case to a plurality of said memory areas disposed as at least one configuration selected from the group consisting of a configuration with said plurality of said memory areas disposed substantially laterally with respect to one another, a configuration with said plurality of said memory areas disposed substantially vertically with respect to one another and a configuration with said plurality of said memory areas disposed in a substantially direct spatial proximity with respect to one another.

9. The semiconductor memory device according to claim 6, wherein at least one of said bit line decoder and said word line decoder is disposed in each case in at least one intermediate region selected from the group consisting of a substantially lateral intermediate region and a substantially vertical intermediate region between at least some of assigned ones of said memory areas.

10. The semiconductor memory device according to claim 6, wherein at least one of said bit line decoder and said word line decoder has a selection circuit.

11. The semiconductor memory device according to claim 1, wherein a respective one of said selection devices is disposed in a substantially direct spatial proximity to an assigned one of said memory areas.

12. The semiconductor memory device according to claim 1, wherein:

one of said memory areas has a region selected from the group consisting of a peripheral region and an edge region; and a respective one of said selection devices is disposed in a substantially direct spatial proximity to said region of said one of said memory areas.

13. The semiconductor memory device according to claim 1, wherein a respective one of said selection devices is configured to be assigned in each case to a plurality of said memory areas disposed as at least one configuration selected from the group consisting of a configuration with said plurality of said memory areas disposed substantially laterally with respect to one another, a configuration with said plurality of said memory areas disposed substantially vertically with respect to one another and a configuration with said plurality of said memory areas disposed in a substantially direct spatial proximity with respect to one another.

14. The semiconductor memory device according to claim 1, wherein a respective one of said selection devices is assigned in each case to a plurality of said memory areas disposed as at least one configuration selected from the group consisting of a configuration with said plurality of said memory areas disposed substantially laterally with respect to one another, a configuration with said plurality of said memory areas disposed substantially vertically with respect to one another and a configuration with said plurality of said memory areas disposed in a substantially direct spatial proximity with respect to one another.

15. The semiconductor memory device according to claim 1, wherein a respective one of said selection devices is disposed in each case in at least one intermediate region selected from the group consisting of a substantially lateral intermediate region and a substantially vertical intermediate region between at least some of assigned ones of said memory areas.

16. The semiconductor memory device according to claim 1, wherein a respective one of said selection devices is configured to select, during operation, in each case at most one of respectively assigned ones of said memory areas for addressing said memory elements.

17. The semiconductor memory device according to claim 1, wherein a respective one of said selection devices is configured to select, during operation, in each case a plurality of respectively assigned ones of said memory areas for addressing said memory elements.

18. The semiconductor memory device according to claim 1, wherein a respective one of said selection devices is configured to select, during operation, in each case a plurality of respectively assigned ones of said memory areas for addressing said memory elements in response to an external area selection signal.

19. The semiconductor memory device according to claim 1, wherein a respective one of said selection devices in each case has a selection circuit for selecting one of assigned ones of said memory areas.

20. The semiconductor memory device according to claim 19, wherein said selection circuit is a selection transistor circuit.

21. The semiconductor memory device according to claim 1, wherein a given one of said selection devices is configured to be assigned to a plurality of said memory areas.

22. The semiconductor memory device according to claim 1, wherein at least one of said selection devices is a global selection device configured to be assigned to a plurality of said memory areas.

* * * * *